(12) United States Patent
Ha et al.

(10) Patent No.: US 8,008,974 B2
(45) Date of Patent: Aug. 30, 2011

(54) POWER AMPLIFIER SYSTEM WITH POWER CONTROL FUNCTION

(75) Inventors: Sang Hoon Ha, Gyunggi-do (KR); Sang Hee Kim, Seoul (KR); Joong Jin Nam, Seoul (KR); Ki Joong Kim, Jeollabuk-do (KR); Jae Hyouck Choi, Gyunggi-do (KR); Shinichi Ilzuka, Gyunggi-do (KR); Youn Suk Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/618,111

(22) Filed: Nov. 13, 2009

(65) Prior Publication Data

US 2010/0156539 A1    Jun. 24, 2010

(51) Int. Cl.
*H03G 3/30*    (2006.01)
(52) U.S. Cl. ........................... 330/285; 330/278
(58) Field of Classification Search ............ 330/285, 330/296, 297, 278–279, 127, 134
See application file for complete search history.

(56) References Cited

U.S. PATENT DOCUMENTS

| | | | |
|---|---|---|---|
| 6,614,309 B1 | 9/2003 | Pehlke | |
| 6,717,471 B2 * | 4/2004 | Arayashiki et al. | 330/278 |
| 6,885,246 B2 * | 4/2005 | Tsutsui et al. | 330/285 |
| 7,420,421 B1 * | 9/2008 | Lie et al. | 330/297 |
| 7,545,217 B1 * | 6/2009 | Reyes | 330/285 |
| 2002/0183019 A1 | 12/2002 | Dent et al. | |
| 2009/0206933 A1 * | 8/2009 | Prikhodko et al. | 330/285 |

FOREIGN PATENT DOCUMENTS

| | | |
|---|---|---|
| JP | 2005504458 A | 2/2005 |
| KR | 1020040085213 A | 10/2004 |
| KR | 10-2006-0057078 A | 5/2006 |
| WO | 03073604 A2 | 9/2003 |

OTHER PUBLICATIONS

Korean Office Action for application No. 10-2008-0132660, issued Jun. 28, 2010.

* cited by examiner

*Primary Examiner* — Hieu P Nguyen
(74) *Attorney, Agent, or Firm* — Lowe, Hauptman, Ham & Berner, LLP

(57) ABSTRACT

A power amplifier system with power control function provides accurate and efficient power control by controlling a bias voltage and a bias current of the power amplifier at the same time. A power amplifier system with power control function according to an aspect of the invention may include: a power amplifier receiving a bias voltage and a bias current from a power voltage source and having a gain controlled according to the magnitude of the bias voltage and the bias current; a voltage detection controller detecting the magnitude of the bias voltage being supplied to the power amplifier and comparing the magnitude of the bias voltage with a predetermined reference voltage to control the magnitude of the bias voltage; and a current detection controller detecting voltage having a magnitude equivalent to the magnitude of the bias current being supplied to the power amplifier and comparing the magnitude of the voltage equivalent to the magnitude of the bias current with the reference voltage to control the magnitude of the bias current.

6 Claims, 2 Drawing Sheets

POWER AMPLIFIER SYSTEM WITH POWER CONTROL FUNCTION

CROSS-REFERENCE TO RELATED APPLICATIONS

This application claims the priority of Korean Patent Application No. 10-2008-0132660 filed on Dec. 23, 2008, in the Korean Intellectual Property Office, the disclosure of which is incorporated herein by reference.

BACKGROUND OF THE INVENTION

1. Field of the Invention

The present invention relates to a power amplifier system including a power amplifier, and more particularly, to a power amplifier system with power control function that provides accurate and efficient power control by controlling a bias voltage and a bias current of the power amplifier at the same time.

2. Description of the Related Art

Recently, with the continuous development of mobile communications, there has been an increasing demand for power amplifiers used to amplify the power of RF signals at RF terminals of mobile communications terminals. Particularly, research has been actively conducted on power amplifiers using CMOS technology appropriate for integration and the reduction of size, weight and thickness of these devices. Great effort has been put into the development of power control circuits of power amplifiers that can stably control the power of power amplifiers.

In the related art, a power control circuit of a power amplifier has used a voltage detection control method of detecting a bias voltage of the power amplifier, comparing the magnitude of the detected bias voltage with a predetermined reference voltage and determining the magnitude of the bias voltage according to the comparison result. Since the voltage detection and control method according to the related art does not consider the magnitude of a bias current, it may be impossible to obtain desired power due to changes of the bias current. In particular, a voltage detection control circuit according to the related art cannot control the power of a power amplifier to desired levels since a bias current changes when the load resistance changes.

SUMMARY OF THE INVENTION

An aspect of the present invention provides a power amplifier system with power control function that can control the power of a power amplifier using both a bias voltage and a bias current.

According to an aspect of the present invention, there is provided a power amplifier system with power control function, the power amplifier system including: a power amplifier receiving a bias voltage and a bias current from a power voltage source and having a gain controlled according to the magnitude of the bias voltage and the bias current; a voltage detection controller detecting the magnitude of the bias voltage being supplied to the power amplifier and comparing the magnitude of the bias voltage with a predetermined reference voltage to control the magnitude of the bias voltage; and a current detection controller detecting voltage having a magnitude equivalent to the magnitude of the bias current being supplied to the power amplifier and comparing the magnitude of the voltage equivalent to the magnitude of the bias current with the reference voltage to control the magnitude of the bias current.

The voltage detection controller may include: a first comparator having one input terminal receiving the reference voltage and the other input terminal connected to a bias voltage input terminal of the power amplifier and receiving the bias voltage, and an output terminal outputting a result of comparing the magnitude of the reference voltage with the bias voltage; and a first transistor having a source and a drain connected to the power voltage source and the bias voltage input terminal of the power amplifier, respectively, and a gate connected to the output terminal of the first comparator.

The current detection controller may include: a second resistor having a gate connected to the gate of the first transistor and a source connected to the power voltage source; an operational amplifier having a non-inverting input terminal and an inverting input terminal connected to the drain of the first transistor and a drain of the second resistor, respectively; a third transistor having a gate connected to an output terminal of the operational amplifier and a drain connected to the drain of the second transistor; a fourth transistor having a gate connected to the gate of the third transistor and a source connected to a source of the third transistor; a fifth transistor having a drain and a gate common-connected to a drain of the fourth transistor and a source receiving voltage equivalent to the power voltage source; a sixth transistor having a gate connected to the gate of the fifth transistor and a source receiving the voltage equivalent to the power voltage source; a current detection resistor having one terminal connected to a drain of the sixth transistor and detecting voltage having a magnitude equivalent to the magnitude of the bias current; a second comparator having two input terminals receiving the reference voltage and voltage at a connection node between a drain of the sixth transistor and the current detection resistor, and an output terminal outputting a result of comparing the magnitude of the reference voltage with the voltage at the connection node between the drain of the sixth transistor and the current detection resistor; and a bias current control circuit forming a current mirror with an input line for the bias current to control the magnitude of the bias current according to the output of the second comparator.

The voltage having the magnitude equivalent to the power voltage source connected to the sources of the fifth and sixth transistors may be supplied from a voltage regulator.

The power amplifier system may further include a predistortion part connected between the one input terminal of the second comparator and the connection node between the drain of the sixth transistor and the current detection resistor, and adjusting the magnitude of the voltage at the connection node between the drain of the sixth transistor and the current detection resistor to a predetermined scale to supply the voltage having the adjusted magnitude to one input terminal of the second comparator.

The power amplifier may include a transistor having a source receiving the bias voltage and the bias current, and the bias current control circuit may include a transistor forming a current mirror with the transistor included in the power amplifier and having a gate receiving the output of the second comparator.

The power amplifier may include a seventh transistor having a source receiving the bias voltage and the bias current and an eighth transistor having a drain connected to the source of the seventh transistor and a source connected to a ground, and the bias current control circuit may include a ninth transistor having a gate connected to a gate of the seventh transistor and receiving the output of the second comparator through the gate thereof and a tenth transistor having a drain and a gate connected to a source of the ninth transistor, a gate connected to a gate of the eighth transistor and a source connected to a ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
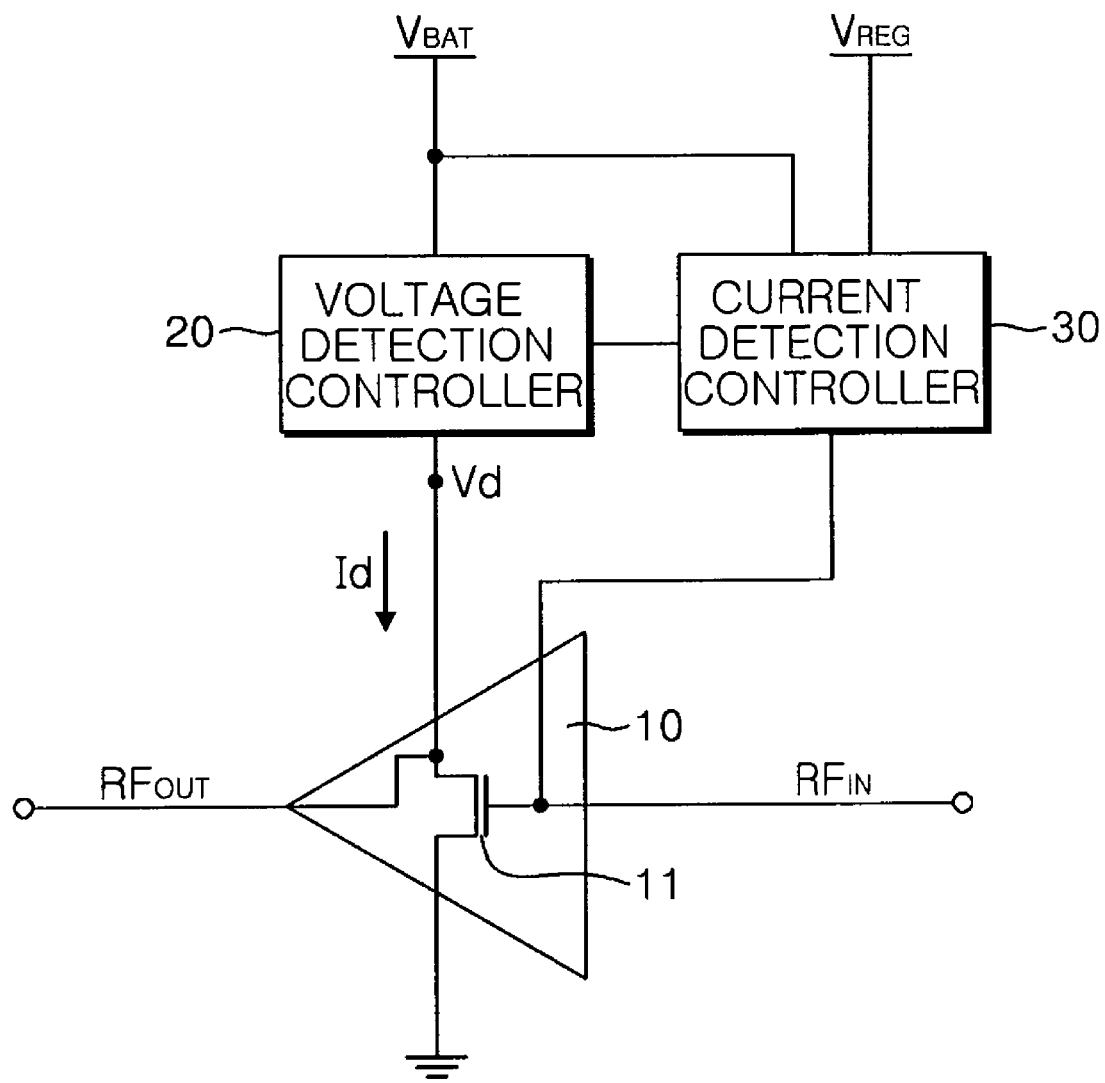
FIG. 1 is a block diagram illustrating a power amplifier system with power control function according to an exemplary embodiment of the invention.
Figure 2:
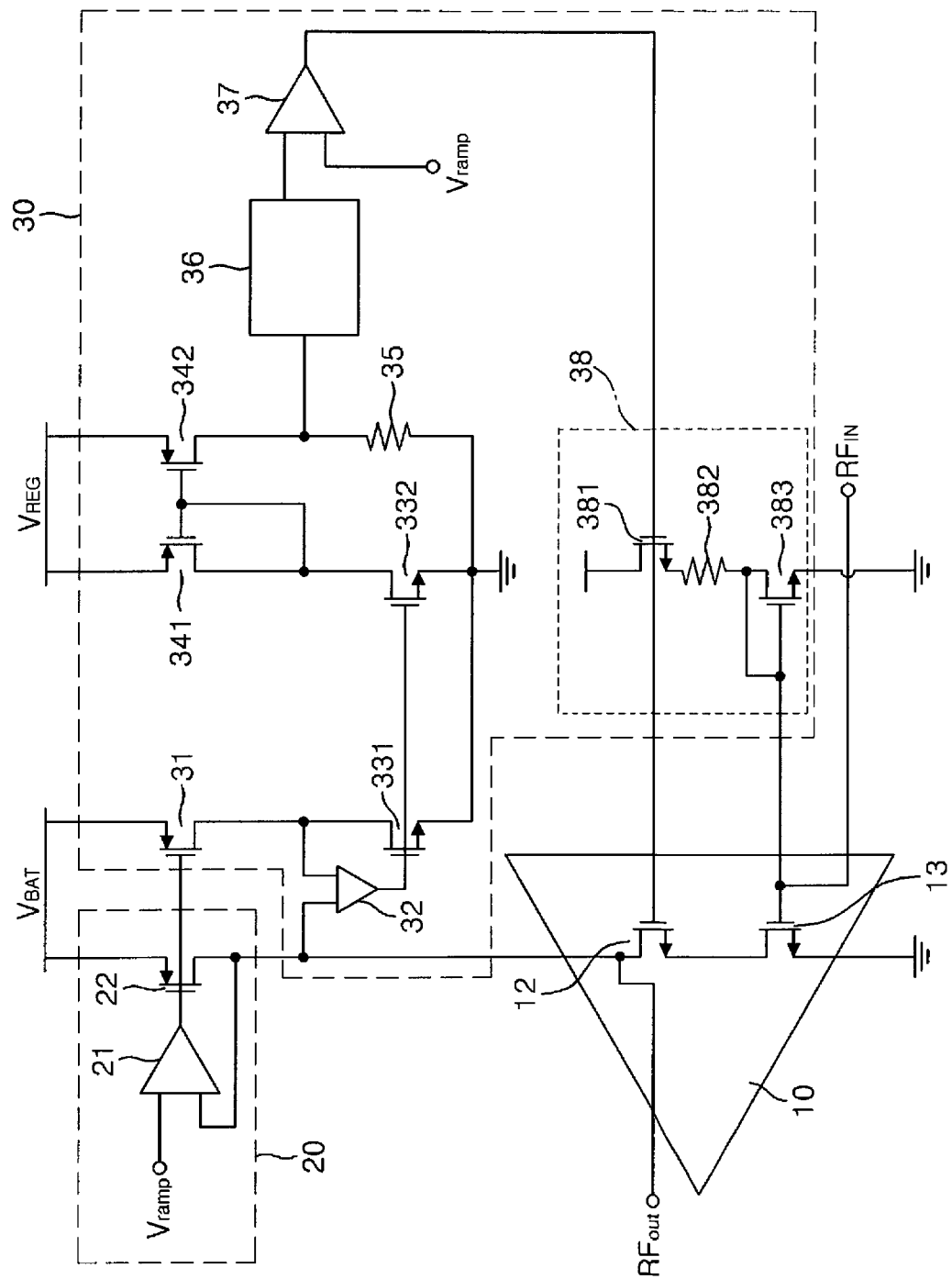
FIG. 2 is a detailed circuit diagram illustrating the power amplifier system, shown in FIG. 1.

FIG. 1 is a block diagram illustrating a power amplifier system with power control function according to an exemplary embodiment of the invention. FIG. 2 is a detailed circuit diagram illustrating the power amplifier system, shown in FIG. 1.

As shown in FIG. 1, a power amplifier system with power control function according to this embodiment includes a power amplifier 10, a voltage detection controller 20 and a current detection controller 30. The voltage detection controller 20 detects a bias voltage Vd being supplied to the power amplifier 10 and controls the magnitude of the detected bias voltage. The current detection controller 30 detects a bias current Id being supplied to the power amplifier 10 and controls the magnitude of the bias current.

The power amplifier 10 may be manufactured using a CMOS process and include at least one transistor. For example, one of the simplest configurations that the power amplifier 10 may have includes a transistor 11 that has a source receiving the bias voltage Vd and the bias current Id. Here, an RF input signal may be input to a gate of the transistor 11, and an amplified RF output signal may be output to a drain of the transistor 11. In another example, as shown in FIG. 2, the power amplifier 10 may be a cascode amplifier that includes a transistor 12 having a source receiving the bias voltage Vd and the bias current Id and a transistor 13 having a drain connected to the source of the transistor 12 and a source connected to a ground. In the example, illustrated in FIG. 2, an RF input signal may be input to a gate of the transistor 13, and an amplified RF output signal may be output to a drain of the transistor 12.

The voltage detection controller 20 detects voltage Vd of a bias voltage input terminal of the power amplifier 10 and compares the magnitude of the detected voltage with a predetermined reference voltage (Vramp of FIG. 2) to control the magnitude of the bias voltage. As shown in FIG. 2, the voltage detection controller 20 may include a comparator 21 and a transistor 22. The comparator 21 compares the magnitude of the bias voltage of the power amplifier 10 with the reference voltage Vramp being supplied from an external source to output the comparison result to an output terminal thereof. The transistor 22 has a source and a drain that are connected to a power voltage source $V_{BAT}$ and the bias voltage input terminal of the power amplifier 10, respectively, and a gate that is connected to the output terminal of the comparator 21.

The current detection controller 30 detects a voltage having a magnitude equivalent to that of the bias current being supplied to the power amplifier 10, and compares the magnitude of the voltage having the magnitude equivalent to that of the bias current with the predetermined reference voltage Vramp to thereby control the magnitude of the bias current. Specifically, as shown in FIG. 2, the current detection controller 30 may include a plurality of current mirror circuits in order to detect the bias current Id. The current detection controller 30 may include a transistor 31, an operational amplifier 32, a transistor 331, a transistor 332, a transistor 341, a transistor 342, a current detection resistor 35, a comparator 37 and a bias current control circuit 38. The transistor 31 includes a gate that is connected to the gate of the transistor 22 of the voltage detection controller 20 and a source connected to the power voltage source $V_{BAT}$. The operational amplifier 32 includes a non-inverting input terminal and an inverting input terminal that are connected to the drains of the transistor 22 and the transistor 31, respectively. The transistor 331 includes a gate connected to the output terminal of the operational amplifier 32 and a drain connected to the drain of the transistor 31. The transistor 332 includes a gate connected to the gate of the transistor 331 and a source connected to a source of the transistor 331. The transistor 341 includes a drain and a gate common-connected to a drain of the transistor 332 and a source receiving a voltage $V_{REG}$ equivalent to the power voltage source. The transistor 342 includes a gate connected to the gate of the transistor 341 and a source receiving the voltage $V_{REG}$ equivalent to the voltage power source. The current detection resistor 35 includes one terminal connected to a drain of the transistor 342 and detects voltage having a magnitude equivalent to that of the bias current. The comparator 37 includes two input terminals receiving the reference voltage Vramp and voltage at a connection node between the drain of the transistor 342 and the current detection resistor 35, and one output terminal outputting a result of comparing the magnitude of the reference voltage Vramp with the voltage at the connection node between the drain of the transistor 342 and the current detection resistor 35. The bias current control circuit 38 forms a current mirror with an input line for the bias current so as to control the magnitude of the bias current Id according to the output of the comparator 37. Here, the current detection controller 30 may further include a predistortion part 36 that is connected between one of the input terminals of the comparator 37 and the connection node between the drain of the transistor 342 and the current detection resistor 35. The predistortion part 36 adjusts the magnitude of the voltage at the connection node between the drain of the transistor 342 and the current detection resistor 35 to a predetermined scale, and supplies the voltage having the adjusted magnitude to one input terminal of the comparator 37.

The bias current control circuit 38 forms a current mirror with the input line for the bias current according to the output of the comparator 37 so as to control the magnitude of the bias current Id. In the embodiment where the power amplifier 10 includes the transistor 11 having the source receiving the bias voltage and the bias current, the bias current control circuit 38 may be implemented as a circuit that includes a gate forming a current mirror with the transistor 11 included in the power amplifier 10 and receiving the output of the comparator 37. Meanwhile, in the embodiment in which the power amplifier 10 includes the transistor 12 having the source receiving the bias voltage and the bias current and the transistor 13 having the drain connected to the source of the transistor 12 and having the source connected to the ground, the bias current control circuit 38 may include a transistor 381 and a transistor 383. The transistor 381 has a gate connected to the gate of the transistor 12 and receiving the output of the comparator 37 through the gate thereof. The transistor 383 has a drain and a gate connected to the source of the transistor 381, the gate connected to the gate of the transistor 13 and a source connected to a ground. A resistor 382 may be further connected between the source of the transistor 381 and the drain of the transistor 383.

The operation and effect of the power amplifier according to the exemplary embodiment of the invention will be described in detail.

As shown in FIG. 2, in the power amplifier system according to this embodiment, the power amplifier 10 may include the two transistors 12 and 13 connected in cascode configuration. An input RF signal $RF_{IN}$ is input to the gate of the transistor 13. The input RF signal $RF_{IN}$ is amplified using a gain controlled by the magnitudes of the bias voltage and the bias current to thereby output an output RF signal $RF_{OUT}$ through the drain of the transistor 12. The bias voltage and the bias current are supplied to the drain of the transistor 12 of the power amplifier 10. That is, in the power amplifier 10, the drain of the transistor 12 serves as an input terminal for the bias voltage and the bias current.

The power amplifier 10 receives the bias voltage and the bias current from the power voltage source $V_{BAT}$ such as a battery. The input terminal (drain of the transistor 12) receiving the bias voltage or the bias current in the power amplifier 10 is connected to one input terminal of the comparator 21 in the voltage detection control unit 20. The reference voltage Vramp, serving as a reference used when the bias voltage is controlled, is supplied from an external source to the other input terminal of the comparator 21. The comparator 21 compares the magnitude of the bias voltage being supplied to the power amplifier 10 with the reference voltage Vramp and outputs a comparison value corresponding to the difference to the gate of the transistor 22 in the voltage detection control unit 20. The resistance between the source and the drain of the transistor 22 is determined according to the comparison value being input to the gate of the transistor 22. Therefore, the resistance of the transistor 22 is adjusted according to the output of the comparator 21 to control the magnitude of voltage drop caused by the transistor 22 to thereby adjust the magnitude of the bias voltage being supplied to the bias voltage input terminal of the power amplifier 10.

The current detection controller 30 controls the magnitude of the current (bias current) of lines connecting from the power voltage source $V_{BAT}$ to the power amplifier 10 at the same time as the voltage detection control unit 20 controls the bias voltage. First, the transistor 31 in the current detection controller 30 is circuit-connected to the transistor 22 in the voltage detection controller 20 so that the transistor 31 and the transistor 22 have the same gate, source and drain voltages. As a result, the bias current is copied to the transistor 31, and the current flows through the source to the drain of the transistor 31. That is, a current flowing through the source to the drain of the transistor 31 becomes a current obtained by detecting the bias current. Here, as the two input terminals of the operational amplifier 32 are connected to the drains of the transistor 22 and the transistor 31, respectively, the drain voltages of the two transistors 22 and 31 can be made equal to each other using a virtual ground at the two input terminals of the operational amplifier 32, thereby enabling more accurate current detection. The magnitude of the actual bias current may be adjusted and copied by adjusting the width and length of the transistor 31 in comparison to the transistor 22. For example, the bias current is copied at a scale of 1:500, and the current flows through the source to the drain of the transistor 31.

The current flowing through the source to the drain of the transistor 31 is mirrored by the transistor 331 and the transistor 332, and is mirrored again by the transistor 341 and the transistor 342. As a result, a current flowing through the source to the drain of the transistor 342 corresponds to the bias current detected by the transistor 31. In this circuit configuration, the sources of the transistors 341 and 342 may be connected to the above-described power voltage source $V_{BAT}$. For more accurate current detection, the sources of the transistors 341 and 342 may be connected to a constant voltage source $V_{REG}$ such as a regulator. As such, in the invention, the bias current is detected using the transistor forming the current mirror with the line through which the bias current is supplied. In the related art, a method of directly connecting a resistor to a bias line so as to detect a current has been known. However, this method may cause voltage and current loss due to the resistance. On the other hand, according to this invention, a current mirror is formed with supply lines of the bias current using transistors, and the bias current is copied using the current mirror so as to detect the bias current. Therefore, this invention can significantly reduce voltage and current loss in comparison to the method of detecting the bias current by directly connecting a resistor to a bias current supplying line according to the related art.

The current flowing through the source to the drain of the transistor 342 is detected as voltage corresponding thereto by the current detection resistor 35 connected to the drain of the transistor 342. That is, voltage varying according to the magnitude of the current flowing through the source to the drain of the transistor 342 is detected at the connection node between the transistor 342 and the current detection resistor 35 having the predetermined resistance.

The voltage detected at the connection node between the current detection resistor 35 and the transistor 342 is supplied to one input terminal of the comparator 37, and the reference voltage Vramp is supplied to the other input terminal of the comparator 37. Then, the comparator 37 compares the magnitude of the voltage equivalent to the bias current with the reference voltage Vramp to thereby output voltage corresponding to the comparison result. As described above, the power amplifier system according to the embodiment of the invention can control the bias voltage and the bias current at the same time by controlling the magnitude of the one reference voltage Vramp.

The predistortion part 36 may be disposed between the comparator 37 and the connection node between the current detection resistor 35 and the transistor 342. The predistortion part 36 adjusts the magnitude of the voltage detected at the connection node between the drain of the transistor 342 and the current detection resistor 35 to the predetermined scale, and then supplies the voltage having the adjusted magnitude to one input terminal of the comparator 37. That is, the predistortion part 36 performs scale adjustment of the magnitude of the voltage detected at the connection node between the current detection resistor 35 and the transistor 342 so that the magnitude of the detected voltage can be compared with that of the reference voltage Vramp.

The comparison result of the comparator 37 is supplied to the bias current control circuit 38. The bias current control circuit 38 forms a current mirror with the line for the power amplifier 10 through which the bias current is supplied so as to control the magnitude of the bias current. Like the embodiment, illustrated in FIG. 2, in which the power amplifier 10 includes the transistor 12 having the source receiving the bias voltage and the bias current and the transistor 13 having the drain connected to the source of the transistor 12 and the source connected to the ground, the bias current control circuit 38 includes the transistor 381 having the gate connected to the gate of the transistor 12 and receiving the output of the comparator 37 through the gate thereof, and the transistor 383 having the drain and the gate connected to the source of the transistor 381, the gate connected to the gate of the transistor 13, and the source connected to the ground. Further, the bias current control circuit 38 implements a current mirror using the transistors 12 and 13 in the power amplifier 10. The magnitude of the current flowing through the drain to the source of the transistor 381 having the gate connected to the output terminal of the comparator 37 is determined according to the result of the comparator 37, so that the magnitude of the current flowing through the transistors 12 and 13 in the power amplifier implementing the current mirror configuration is determined.

As described above, according to the embodiment of the invention, the bias voltage and the bias current of the power amplifier 10 can be controlled at the same time using one reference voltage Vramp. Therefore, according to this invention, the power of the power amplifier can be more accurately controlled than the general method of controlling the power of the power amplifier only using the bias voltage. In particular, in the general method of only using the bias voltage, the magnitude of the bias current varies according to changes of the load resistance. However, in the embodiment of the invention, the magnitude of the bias current and the magnitude of the bias voltage are controlled at the same time to thereby minimize changes of the bias current caused by changes of the load resistance.

Furthermore, a current can be accurately detected by applying a constant voltage source, such as a voltage regulator, but not by applying a power voltage source, such as a general battery, to a current mirror circuit configuration to detect a current.

In addition, according to the embodiment of the invention, a current mirror is implemented with a bias current supplying line using transistors together, and the bias current is copied using the current mirror so as to detect the bias current. Therefore, in comparison with the general current detection method of directly connecting a resistor to a bias current supplying line to detect a bias current, voltage and current loss can be significantly reduced.

As set forth above, according to exemplary embodiments of the invention, the power of a power amplifier can be accurately controlled by controlling a bias voltage and a bias current at the same time, not by controlling a bias voltage or a bias current.

Furthermore, according to an exemplary embodiment of the invention, a current mirror is implemented with a bias current supplying line using transistors, and a bias current is copied using the current mirror so as to detect the bias current, thereby reducing voltage and current loss caused when a current is detected.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier system, comprising:
   a power amplifier for receiving a bias voltage and a bias current from a power voltage source and having a gain controlled according to the magnitude of the bias voltage and the bias current;
   a voltage detection controller for detecting the magnitude of the bias voltage being supplied to the power amplifier and for comparing the magnitude of the bias voltage with a predetermined reference voltage to control the magnitude of the bias voltage; and
   a current detection controller for detecting a voltage having a magnitude equivalent to the magnitude of the bias current being supplied to the power amplifier and for comparing the magnitude of the voltage equivalent to the magnitude of the bias current with the predetermined reference voltage to control the magnitude of the bias current,
   wherein the voltage detection controller comprises:
   a first comparator having:
      one input terminal for receiving the reference voltage;
      another input terminal connected to a bias voltage input terminal of the power amplifier for receiving the bias voltage; and
      an output terminal for outputting a result of comparing the reference voltage with the magnitude of the bias voltage; and
   a first transistor having:
      a source connectable to the power voltage source;
      a drain connected to the bias voltage input terminal of the power amplifier; and
      a gate connected to the output terminal of the first comparator.

2. The power amplifier system of claim 1, wherein the current detection controller comprises:
   a second transistor having:
      a gate connected to the gate of the first transistor; and
      a source connectable to the power voltage source;
   an operational amplifier having a non-inverting input terminal and an inverting input terminal connected to the drain of the first transistor and a drain of the second transistor, respectively;
   a third transistor having:
      a gate connected to an output terminal of the operational amplifier; and
      a drain connected to the drain of the second transistor;
   a fourth transistor having:
      a gate connected to the gate of the third transistor; and
      a source connected to a source of the third transistor;
   a fifth transistor having:
      a drain and a gate commonly-connected to a drain of the fourth transistor; and
      a source for receiving voltage equivalent to the power voltage source;
   a sixth transistor having:
      a gate connected to the gate of the fifth transistor; and
      a source for receiving the voltage equivalent to the power voltage source;
   a current detection resistor having one terminal connected to a drain of the sixth transistor and for detecting the voltage having the magnitude equivalent to the magnitude of the bias current;
   a second comparator having:
      two input terminals for receiving the reference voltage and a voltage at a connection node between the drain of the sixth transistor and said one terminal of the current detection resistor; and an output terminal for outputting a result of comparing the reference voltage with the voltage at the connection node; and a bias current control circuit for forming a current mirror with an input line for the bias current to control the magnitude of the bias current according to the result output from the output terminal of the second comparator.

3. The power amplifier system of claim 2, wherein the sources of the fifth and sixth transistors are adapted to receive the voltage having the magnitude equivalent to the power voltage source from a voltage regulator.

4. The power amplifier system of claim 2, further comprising a predistortion part connected between one of the two input terminals of the second comparator and the connection node for adjusting the magnitude of the voltage at the connection node to a predetermined scale to supply the voltage having the adjusted magnitude to said one of the two input terminals of the second comparator.

5. The power amplifier system of claim 2, wherein the power amplifier comprises a transistor having a source for receiving the bias voltage and the bias current, and the bias current control circuit comprises a transistor forming a current minor with the transistor included in the power amplifier and having a gate connected to the output terminal of the second comparator.

6. The power amplifier system of claim 2, wherein the power amplifier comprises:

a seventh transistor having a source for receiving the bias voltage and the bias current; and an eighth transistor having a drain connected to the source of the seventh transistor and a source connected to the ground, and the bias current control circuit comprises:

a ninth transistor having a gate connected to a gate of the seventh transistor and to the output terminal of the second comparator; and a tenth transistor having a drain and a gate connected to a source of the ninth transistor, a gate connected to a gate of the eighth transistor, and a source connected to the ground.

\* \* \* \* \*